(12) United States Patent
Roh et al.

(10) Patent No.: US 11,294,498 B2
(45) Date of Patent: Apr. 5, 2022

(54) TOUCH SENSOR AND DISPLAY DEVICE INCLUDING THE SAME

(71) Applicant: Samsung Display Co., Ltd., Yongin-si (KR)

(72) Inventors: Myong Hoon Roh, Cheonan-si (KR); Jung Su Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/907,275

(22) Filed: Jun. 21, 2020

(65) Prior Publication Data
US 2021/0132765 A1 May 6, 2021

(30) Foreign Application Priority Data

Oct. 31, 2019 (KR) .................. 10-2019-0137995

(51) Int. Cl.
*G06F 3/041* (2006.01)
*G06F 3/044* (2006.01)
*H01L 27/32* (2006.01)

(52) U.S. Cl.
CPC ........ *G06F 3/04164* (2019.05); *G06F 3/0446* (2019.05); *H01L 27/323* (2013.01)

(58) Field of Classification Search
None
See application file for complete search history.

(56) References Cited

U.S. PATENT DOCUMENTS

| 2011/0134056 | A1* | 6/2011 | Kim | .............. G06F 3/0412 345/173 |
| 2015/0355747 | A1* | 12/2015 | Lin | ............... H01L 24/06 345/174 |
| 2017/0285779 | A1* | 10/2017 | Ryu | ............... H05K 1/189 |
| 2018/0131031 | A1 | 5/2018 | Ku et al. | |
| 2019/0223289 | A1* | 7/2019 | Kim | ........... G02F 1/136277 |
| 2020/0194468 | A1* | 6/2020 | Luo | ............... H05K 3/361 |

FOREIGN PATENT DOCUMENTS

| JP | H07-20485 | 1/1995 |
| JP | H07-169522 | 7/1995 |
| JP | 2004-061979 | 2/2004 |
| JP | 2012-227480 | 11/2012 |

* cited by examiner

*Primary Examiner* — Krishna P Neupane
(74) *Attorney, Agent, or Firm* — H.C. Park & Associates, PLC

(57) ABSTRACT

A touch sensor includes a touch sensing region, a touch sensing electrode in the touch sensing region, a touch extending wire extended to the touch sensing electrode, a touch pad on an end of the touch extending wire, a flexible printed circuit board overlapping the touch pad, a flexible printed circuit pad on the flexible printed circuit board and facing the touch pad, and a conductive bonding member between the touch pad and the flexible printed circuit pad. The conductive bonding member is bonded to each of the touch pad and the flexible printed circuit pad. The touch pad includes a first touch pad layer made of a transparent metal oxide, and a second touch pad layer on the first touch pad layer. The second touch pad layer is made of a metal material. The conductive bonding member is bonded to the second touch pad layer.

13 Claims, 8 Drawing Sheets

TOUCH SENSOR AND DISPLAY DEVICE INCLUDING THE SAME

CROSS-REFERENCE TO RELATED APPLICATION

This application claims priority to and the benefit of Korean Patent Application No. 10-2019-0137995, filed Oct. 31, 2019, which is hereby incorporated by reference for all purposes as if fully set forth herein.

BACKGROUND

Field

Some exemplary embodiments generally relate to a touch sensor and a display device including the same.

Discussion

A display device is a device for displaying an image, and may include a liquid crystal display (LCD), an organic light emitting diode (OLED) display, and the like. The display device may be used in various electronic devices, such as a mobile phone, a navigation device, a digital camera, an electronic book, a portable game machine, various terminals, etc. An input device for the electronic device may include a touch sensor for a user to contact (or otherwise interact with) a screen with a finger or a pen to input information. From among various sensing methods of touch sensors, a capacitive type for sensing a position where a change in capacitance caused by a contact is generated from two electrodes separated from each other is generally used. A touch pad of a touch sensor may be connected to a flexible printed circuit pad. It is also recognized that methods and devices for reducing the thickness of electronic devices and the size of bezels are being explored. Accordingly, the touch pad is becoming smaller. As the touch pad becomes smaller, an electrical connection to the flexible printed circuit pad may generate defects.

The above information disclosed in this section is only for understanding the background of the inventive concepts, and, therefore, may contain information that does not form prior art.

SUMMARY

Some aspects provide a touch sensor capable of allowing an electrical connection between a touch pad and a flexible printed circuit pad to be properly performed and more reliable.

Some aspects provide a display device including a touch sensor capable of allowing an electrical connection between a touch pad and a flexible printed circuit pad to be properly performed and more reliable.

Additional aspects will be set forth in the detailed description which follows, and, in part, will be apparent from the disclosure, or may be learned by practice of the inventive concepts.

According to some aspects, a touch sensor includes a touch sensing region, a touch sensing electrode in the touch sensing region, a touch extending wire extended to the touch sensing electrode, a touch pad on an end of the touch extending wire, a flexible printed circuit board overlapping the touch pad, a flexible printed circuit pad on the flexible printed circuit board and facing the touch pad, and a conductive bonding member between the touch pad and the flexible printed circuit pad. The conductive bonding member is bonded to each of the touch pad and the flexible printed circuit pad. The touch pad includes a first touch pad layer made of a transparent metal oxide, and a second touch pad layer on the first touch pad layer. The second touch pad layer is made of a metal material. The conductive bonding member is bonded to the second touch pad layer.

According to some aspects, a display device includes a substrate, a light-emitting device, an encapsulation structure, a touch sensing electrode, a touch extending wire, a touch pad, a flexible printed circuit board, a flexible printed circuit pad, and a conductive bonding member. The substrate includes a touch sensing region. The light-emitting device is on the substrate. The encapsulation structure is on the light-emitting device. The touch sensing electrode is in the touch sensing region on the encapsulation structure. The touch extending wire is extended to the touch sensing electrode. The touch pad is on an end of the touch extending wire. The flexible printed circuit board overlaps the touch pad. The flexible printed circuit pad is on the flexible printed circuit board and faces the touch pad. The conductive bonding member is between the touch pad and the flexible printed circuit pad. The conductive bonding member is bonded to each of the touch pad and the flexible printed circuit pad. The touch pad includes a first touch pad layer made of a transparent metal oxide, and a second touch pad layer on the first touch pad layer. The second touch pad layer is made of a metal material. The conductive bonding member is bonded to the second touch pad layer.

According to various exemplary embodiments, the touch pad and the flexible printed circuit pad may be bonded with a conductive ball so that an electrical connection between the touch pad and the flexible printed circuit pad may be stably formed/performed.

DETAILED DESCRIPTION OF SOME EXEMPLARY EMBODIMENTS

Figure 1:
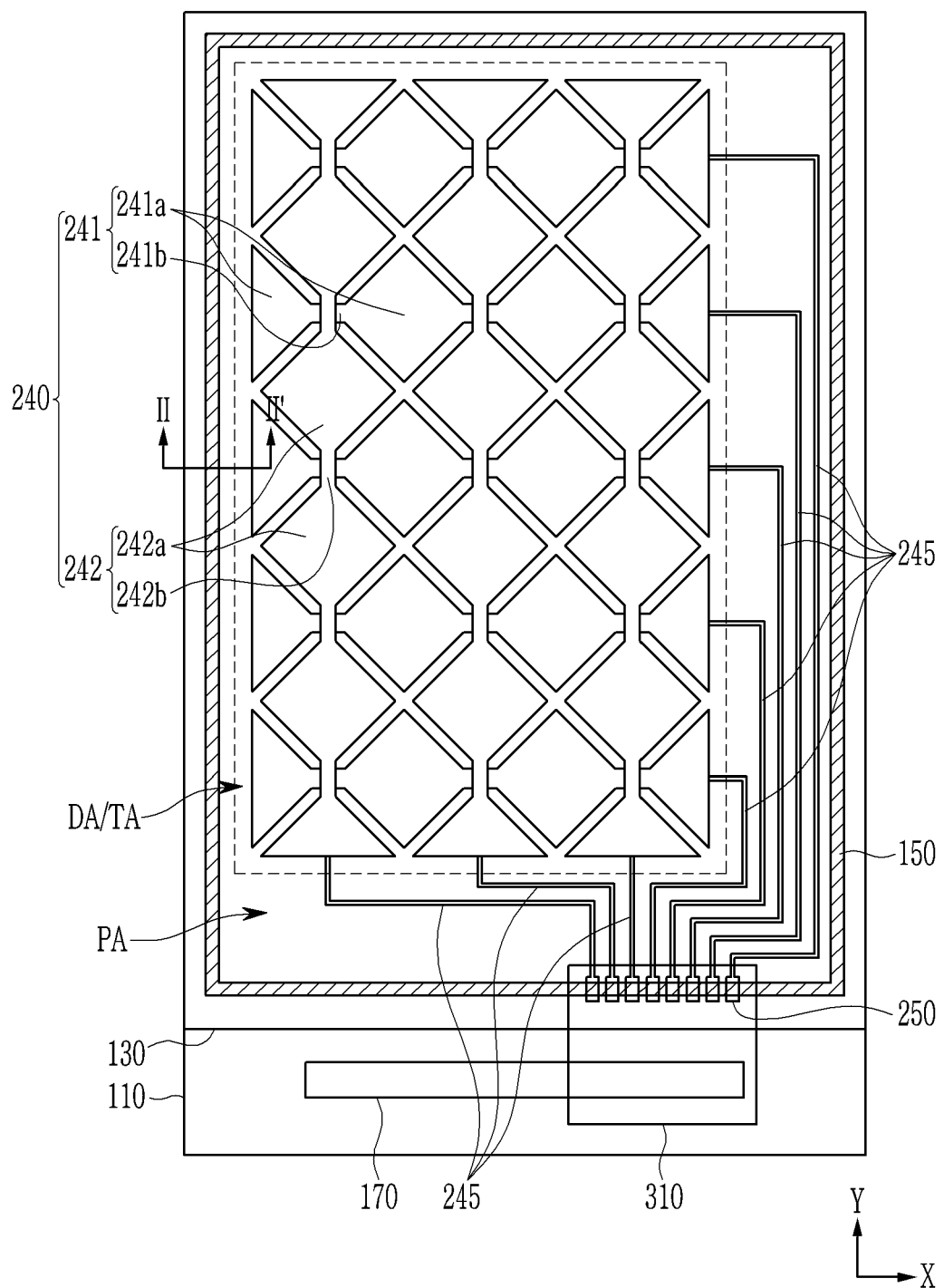
FIG. 1 shows a top plan view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly. Additionally, the phrase "on a plane" means viewing an object portion from the top, and the phrase "on a cross-section" means viewing a cross-section of which an object portion is vertically cut from the side.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts Hereinafter, various exemplary embodiments will be explained in detail with reference to the accompanying drawings.

A display device according to some exemplary embodiments will now be described with reference to FIGS. 1 and 2.

FIG. 1 shows a top plan view of a display device according to some exemplary embodiments. FIG. 2 shows a cross-sectional view with respect to sectional line II-II of FIG. 1 according to some exemplary embodiments.

Figure 2:
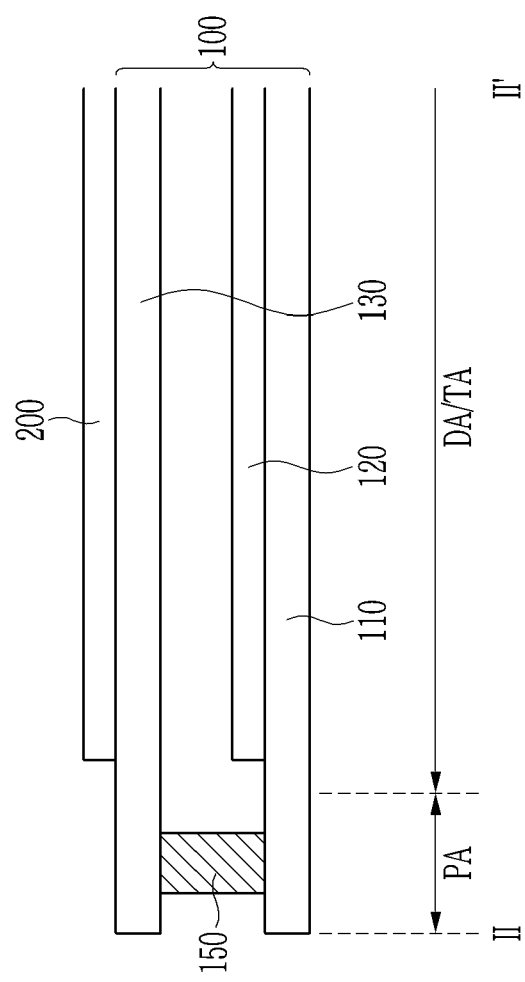
FIG. 2 shows a cross-sectional view with respect to sectional line II-II' of FIG. 1 according to some exemplary embodiments.

As shown in FIGS. 1 and 2, the display device includes a display panel 100 and a touch sensor 200 provided on the display panel 100.

The display device includes a display area DA and a peripheral area PA provided outside the display area DA. The display area DA represents a region for displaying an image according to on/off operations of a plurality of pixels included in the display panel 100. The peripheral area PA represents a region in which a driving circuit for driving a plurality of pixels of the display area DA is mounted or formed. The display device according to an exemplary embodiment may further include a touch sensing region TA. The touch sensing region TA represents a region for sensing a touch (or touch interaction) by the touch sensor 200. The touch sensing region TA may correspond to the display area DA. This, however, is an example, and the touch sensing region TA may not correspond to the display area DA. For example, the touch sensing region TA may be narrower and/or wider than the display area DA.

The display panel 100 may be flexible, stretchable, foldable, bendable, or rollable, embodiments are not limited thereto. For instance, the display panel 100 may be bent on a border between the display area DA and the peripheral area PA. The peripheral area PA may be bent from the display area DA and may be provided on a rear side of the display area DA. This, however, is an example, and the peripheral area PA may have various modifiable positions.

The display panel 100 includes a substrate 110, a light-emitting device 120 provided on the substrate 110, and an encapsulation substrate 130 provided on the light-emitting device 120.

The substrate 110 may be an insulating substrate made of at least one of glass, quartz, ceramic, and plastic, or it may be a metallic substrate made of stainless steel.

A plurality of pixels may be disposed in formation (e.g., a matrix formation) on the substrate 110, and the pixels may receive an image signal and may output an image. The light-emitting device 120 may be provided in the display area DA, and it may be provided for each pixel. For instance, the display panel 100 may include a plurality of light-emitting devices 120. The disposal (or positioning) of a plurality of pixels is modifiable in various ways. Further, a plurality of signal lines may be further provided on the substrate 110. The signal lines may include a plurality of scan lines, a plurality of control lines, a plurality of data lines, and a plurality of driving voltage lines. The signal lines may respectively transmit a scan signal, a control signal, a data signal, and a driving voltage. A plurality of signal lines may be provided to traverse each other in a row direction or a column direction. The respective pixels may include a plurality of transistors and capacitors connected to a plurality of signal lines. The light-emitting device 120 may include an organic light emitting diode (OLED), and it may be connected to a plurality of signal lines through the transistors and the capacitors. As described, the display panel 100 may include an organic light emitting panel, but types of the display panel 100 are not limited thereto. In other words, the display panel 100 may include various kinds of panels. For example, the display panel 100 may include a liquid crystal panel, an electrophoretic display panel, an electro-wetting display panel, or the like.

The encapsulation substrate 130 may be provided to face the substrate 110, and may have a similar shape to the substrate 110. For example, the encapsulation substrate 130 and the substrate 110 may be substantially formed to have a rectangular (or generally rectangular) shape. The encapsulation substrate 130 may have a similar size to the substrate 110, or the encapsulation substrate 130 may be smaller than the substrate 110. The encapsulation substrate 130 may be made of at least one glass and plastic, and it may be made of a transparent material.

A sealing member 150 may be further provided between the substrate 110 and the encapsulation substrate 130. The sealing member 150 may be provided in the peripheral area PA. The sealing member 150 may be formed to surround the display area DA in a plan view. Therefore, the light-emitting device 120 provided in the display area DA may be surrounded and sealed by the sealing member 150, the substrate 110, and the encapsulation substrate 130. As such, the substrate 110 and the encapsulation substrate 130 may be bonded together by the sealing member 150. The sealing member 150 may be formed by a process of applying a glass material, such as frit, to the peripheral area PA provided between the substrate 110 and the encapsulation substrate 130 and irradiating ultraviolet (UV) rays thereto to cure the same.

Most of the region of the substrate 110 is covered by the encapsulation substrate 130. A predetermined region of the substrate 110 may not be covered by the encapsulation substrate 130, but may be exposed to the outside. A driving circuit chip 170 may be provided on the predetermined region of the substrate 110 not covered by the encapsulation substrate 130. The driving circuit chip 170 may be provided at (or near) an edge on one side of the substrate 110, for example, a bottom edge of the substrate 110. This, however, is an example, and the driving circuit chip 170 may have various modifiable positions. For example, the driving circuit chip 170 may be provided on a top edge of the substrate 110. The driving circuit chip 170 may be connected to a plurality of pixels provided in the display area DA, and may transmit various signals to a plurality of pixels. For example, the driving circuit chip 170 may supply a scan signal, a control signal, a data signal, and a driving voltage.

A flexible circuit board may be further provided on an edge of one side of the substrate 110. A circuit for controlling driving of the display panel 100 may be disposed on the flexible circuit board, and it may be attached to an edge on one side of the substrate 110.

The touch sensor 200 may sense a contact of an external object, such as a hand or a pen, generated in the touch sensing region TA. The touch sensor 200 may also sense the case in which the external object hovers while it is provided near or has already approached the same in addition to the case in which the external object directly contacts the same.

The touch sensor 200 may be provided on an external side of the display panel 100 (i.e., an on-cell type) or on an internal side thereof (i.e., an in-cell type). Further, the touch sensor 200 may be provided on an additional panel and may be attached to the display panel 100 (i.e., an add-on type). The case in which the touch sensor 200 is provided on the external side of the display panel 100 will now be described. However, exemplary embodiments are not limited thereto, and the touch sensor 200 may have various changeable positions.

The touch sensor 200 may be provided on the encapsulation substrate 130. An anti-reflection layer for reducing reflection of external light may be further provided on the touch sensor 200. The anti-reflection layer may include a polarization layer including a linear polarizer and a retarder. A cover window may be further provided on the touch sensor 200. The cover window may protect the touch sensor 200 and the display panel 100 provided thereunder.

The touch sensor 200 includes a touch sensing electrode 240 provided in the touch sensing region TA, a touch extending wire 245 extended to the touch sensing electrode 240, and a touch pad 250 provided to an end of the touch extending wire 245.

The touch sensing electrode 240 may include a first touch sensing electrode 241 extending in a first direction X, and a second touch sensing electrode 242 extending in a second direction Y traversing (or crossing) the first direction X.

The first touch sensing electrode 241 may include a plurality of first sensing cells 241a disposed in the first direction X, and a plurality of first connectors 241b extending in the first direction X and connecting the first sensing cells 241a. The first touch sensing electrode 241 may represent a transmitter (Tx) touch electrode for receiving a first touch signal for sensing a coordinate value of the second direction Y. The first sensing cell 241a may substantially have a rhombus shape. This, however, is an example, and the first sensing cell 241a may have various modifiable shapes. For example, the first sensing cell 241a may be formed to be polygonal such as hexagonal, or circular or oval. The first sensing cell 241a may be formed to have a mesh shape. For example, the first sensing cell 241a may form a mesh shape as a plurality of conductive fine lines that may be disposed to cross each other. Further, the first sensing cell 241a may have various shapes, such as protrusions, to improve sensitivity of the touch sensor.

The second touch sensing electrode 242 may include a plurality of second sensing cells 242a disposed in the second direction Y, and a plurality of second connectors 242b extending in the second direction Y and connecting a plurality of second sensing cells 242a to each other. The second touch sensing electrode 242 may represent a receiver (Rx) touch electrode for receiving a second touch signal for sensing a coordinate value of the first direction X. The second sensing cell 242a may substantially have a rhombus shape. This, however, is an example, and the second sensing cell 242a may have various modifiable shapes. For example, the second sensing cell 242a may be formed to be polygonal, such as hexagonal, circular, or oval. The second sensing cell 242a may be formed to have a mesh shape. For instance, the second sensing cell 242a may form a mesh shape as a plurality of conductive fine lines that cross each other. Further, the second sensing cell 242a may have various shapes, such as protrusions, to improve sensitivity of the touch sensor.

The first touch sensing electrode 241 and the second touch sensing electrode 242 may be provided on different layers. In a plan view, the first sensing cell 241a and the second sensing cell 242a may neighbor each other, and the first connector 241b and the second connector 242b may overlap each other and may be insulated from each other by an insulating layer. For instance, an insulating layer may be provided between the first touch sensing electrode 241 and the second touch sensing electrode 242. This, however, is an example, and at least part of the first touch sensing electrode 241 and the second touch sensing electrode 242 may be provided on the same layer. For example, the first sensing cell 241a and the second sensing cell 242a may be provided on the same layer. In this instance, one of the first connector 241b and the second connector 242b may be provided on the same layer as the first sensing cell 241a and the second sensing cell 242a, and the other may be provided on a different layer from the first sensing cell 241a and the second sensing cell 242a. For example, the first connector 241b may be provided on the same layer as the first sensing cell 241a and the second sensing cell 242a, and the second connector 242b may be provided on a different layer from the first connector 241b. An insulating layer may be provided between the second connector 242b and the second sensing cell 242a, and the second connector 242b may be connected to the second sensing cell 242a through a contact hole formed in the insulating layer.

The touch sensing electrode 240 may include a low resistance metal, such as at least one of silver (Ag), aluminum (Al), copper (Cu), chromium (Cr), and nickel (Ni), and/or it may include a conductive nanomaterial, such as at least one of silver nanowires and carbon nanotubes. Further, the touch sensing electrode 240 may include a transparent metal oxide, such as at least one of an indium-tin oxide (ITO) and an indium-zinc oxide (IZO). In addition, the touch sensing electrode 240 may be formed as a multilayer structure, such as formed including a titanium (Ti)/aluminum (Al)/titanium (Ti) structure. The touch sensing electrode 240 has low resistance to reduce resistance-capacitance (RC) delay, and it has excellent flexibility so that the touch sensing electrode 240 is not easily cracked by repeated deformation, such as bending.

The first touch sensing electrode 241 and the second touch sensing electrode 242 neighboring each other may form a mutual capacitor functioning as a touch sensor. The mutual capacitor may receive a driving signal through one of the first touch sensing electrode 241 and the second touch sensing electrode 242, and may output a change of an amount of charges caused by a touch by an external object as an output signal through the other touch electrode of the first touch electrode 241 and the second touch electrode 242. Differing from this, a plurality of first touch sensing electrodes 241 may be separated from each other and a plurality of second touch sensing electrodes 242 may be separated from each other to form independent touch electrodes. In this instance, the respective touch sensing electrodes may form a self-capacitor as a touch sensor. The self-capacitor may receive a driving signal and may be stored with a predetermined amount of charges, and when a touch is generated, the stored amount of charges changes, and the self-capacitor may output an output signal that is different from the input driving signal.

The touch extending wire 245 is extended to an end of the touch sensing electrode 240. The touch sensing electrode 240 provided near the peripheral area PA may be extended to the touch extending wire 245. An end on a first side of the touch extending wire 245 may be extended to the touch sensing electrode 240 and may be provided in the touch sensing region TA, but embodiments are not limited thereto. Most of the touch extending wire 245 may be provided in the peripheral area PA. An end on a second side of the touch extending wire 245 is extended to the touch pad 250.

The touch pad 250 may be provided on an end of the touch extending wire 245. The touch pad 250 may be provided in the peripheral area PA. The touch pad 250 may be provided on a right bottom end of the display panel 100. However, the position of the touch pad 250 is an example, and it is modifiable in various ways. For example, the touch pad 250 may be provided on a bottom center end or a top right end of the display panel 100, or may be divided onto various portions of the display panel 100. The touch sensor 200 may include a plurality of touch pads 250. The number of touch pads 250 may be substantially equivalent to the number of touch extending wires 245.

The touch sensor 200 may further include a flexible printed circuit board 310 provided on the encapsulation substrate 130. The flexible printed circuit board 310 may be provided in the peripheral area PA and may overlap the touch pad 250. The flexible printed circuit board 310 includes a circuit for receiving a touch signal from the touch sensing electrode 240 through the touch extending wire 245 and the touch pad 250, and may sense whether a touch is generated.

A touch sensor of the display device according to some exemplary embodiments will now be described with reference to FIGS. 3 to 5.

Figure 3:
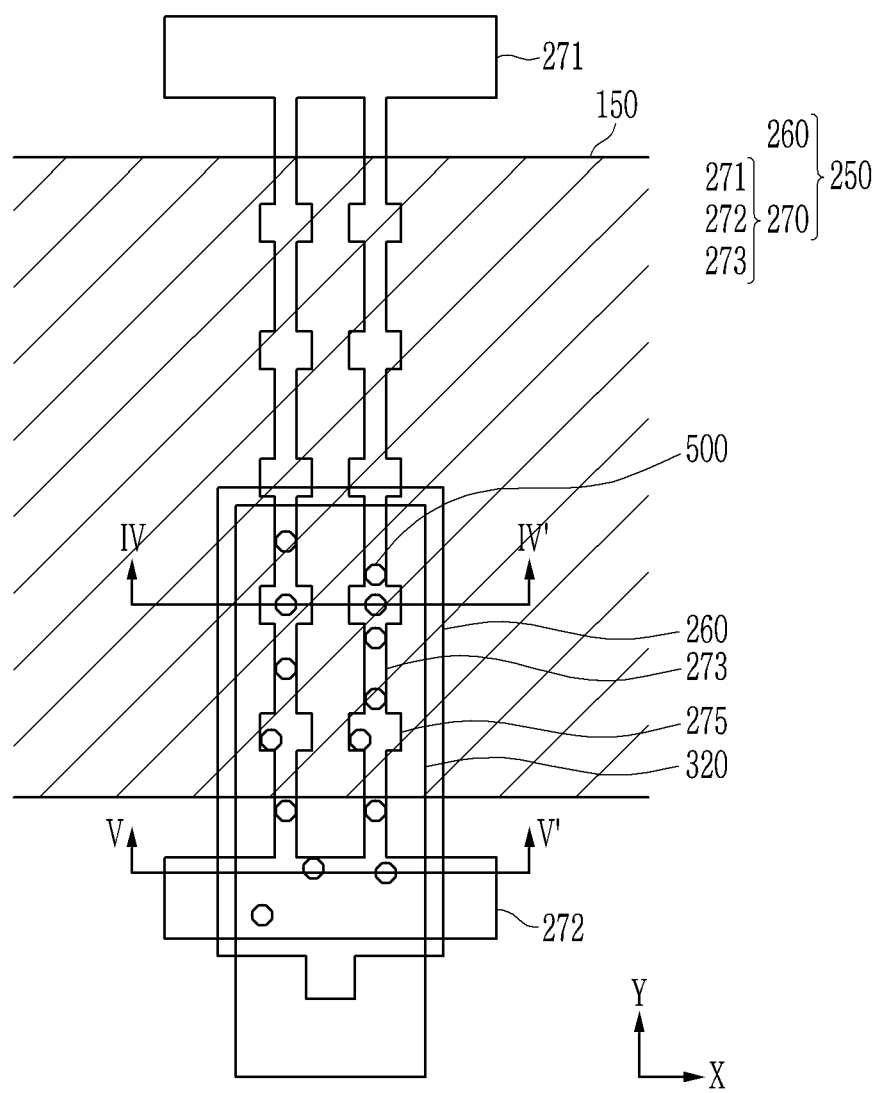
FIG. 3 shows an enlarged top plan view of a predetermined region of a display device according to some exemplary embodiments.

FIG. 3 shows an enlarged top plan view of a predetermined region of a display device according to some exemplary embodiments. FIG. 4 shows a cross-sectional view with respect to sectional line IV-IV' of FIG. 3 according to some exemplary embodiments. FIG. 5 shows a cross-sectional view with respect to sectional line V-V' of FIG. 3 according to some exemplary embodiments. As such, FIGS. 3 to 5 show a touch pad of a touch sensor of a display device according to some exemplary embodiments and a peripheral side thereof.

Figure 4:
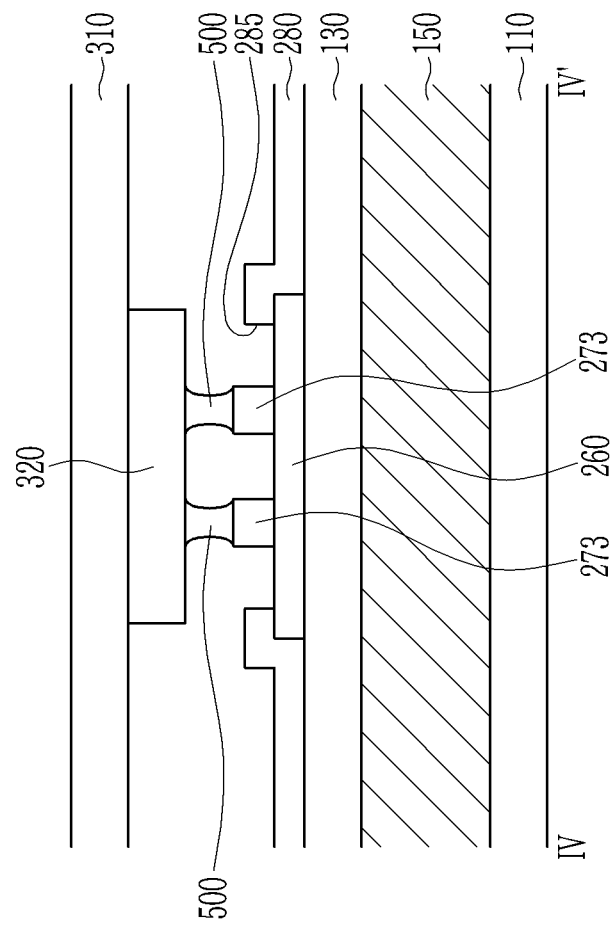
FIG. 4 shows a cross-sectional view with respect to sectional line IV-IV of FIG. 3 according to some exemplary embodiments.
Figure 5:
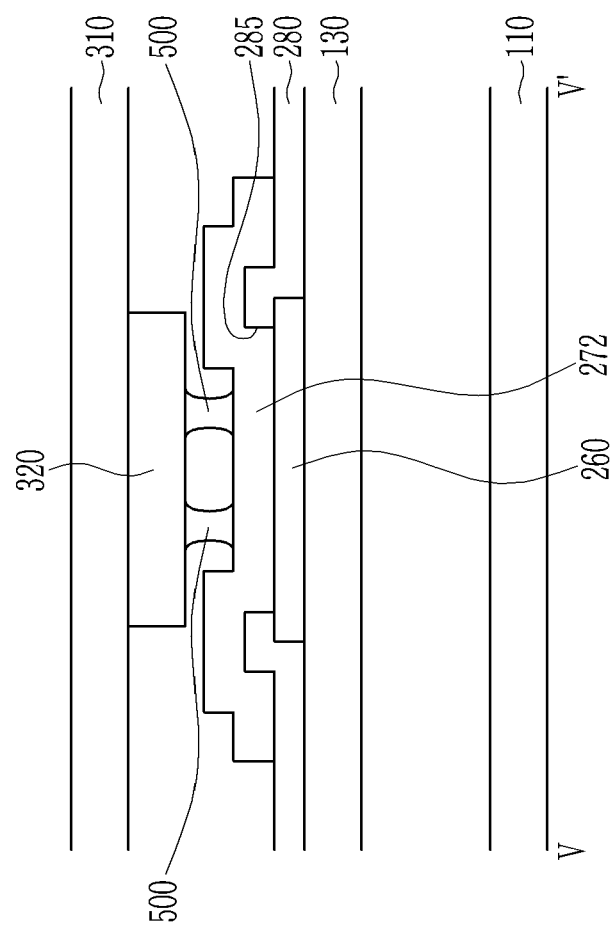
FIG. 5 shows a cross-sectional view with respect to sectional line V-V' of FIG. 3 according to some exemplary embodiments.

As shown in FIGS. 3 to 5, the touch sensor 200 of a display device according to some exemplary embodiments includes a touch pad 250, a flexible printed circuit board 310 overlapping the touch pad 250, and a conductive bonding member (or structure) 500 provided between the touch pad 250 and the flexible printed circuit board 310.

The touch pad 250 may include a second touch pad layer 270 provided on a first touch pad layer 260 and the first touch pad layer 260.

The first touch pad layer 260 may be provided on an encapsulation substrate 130 of the display panel 100. The first touch pad layer 260 may be provided on the encapsulation substrate 130, and another layer may be further provided between the first touch pad layer 260 and the encapsulation substrate 130. The first touch pad layer 260 may be made of a transparent metal oxide. For example, the first touch pad layer 260 may be made of a transparent metal oxide, such as at least one of an indium-tin oxide (ITO) and an indium-zinc oxide (IZO). The first touch pad layer 260 may be formed to have a rectangular (or generally rectangular) form extending substantially in the second direction Y in a plan view. The first touch pad layer 260 may be formed to be a rectangle (or a generally rectangular shape) including two short sides in parallel with the first direction X and two long sides in parallel with the second direction Y. This, however, is an example, and the first touch pad layer 260 may have various planar shapes.

A passivation layer 280 may be provided on the first touch pad layer 260 and the encapsulation substrate 130. The passivation layer 280 may be made of an organic insulating material or an inorganic insulating material, and it may be formed to be a single layer or a multilayer structure. A contact hole 285 overlapping at least part of the first touch pad layer 260 is formed in the passivation layer 280. At least part of an upper side of the first touch pad layer 260 may be exposed by the contact hole 285.

The second touch pad layer 270 may be provided on the first touch pad layer 260 and the passivation layer 280. The second touch pad layer 270 may be provided on the first touch pad layer 260. Therefore, the second touch pad layer 270 may contact the first touch pad layer 260, and the second touch pad layer 270 may be electrically connected to the first touch pad layer 260. The second touch pad layer 270 may be made of various metal materials, such as at least one of molybdenum (Mo), silver (Ag), titanium (Ti), copper (Cu), and aluminum (Al), and may include a single layer or multilayer structure, such as a multilayer structure of molybdenum/aluminum/molybdenum (Mo/Al/Mo). The second touch pad layer 270 may substantially extend in the second direction Y in a plan view. For instance, the second touch pad layer 270 may extend in parallel to the first touch pad layer 260.

The second touch pad layer 270 includes a first portion 271 and a second portion 272 separated from each other in a plan view, and a extender 273 for extending to the first portion 271 and the second portion 272. The first portion 271 and the second portion 272 may be formed to have a quadrangular (or generally quadrangular) shape, and they may have similar planar shapes. This, however, is an example, and the first portion 271 and the second portion 272 may have various modifiable shapes. Further, the first portion 271 and the second portion 272 may have different shapes. The extender 273 may be formed to have a bar (or generally bar) shape extending in the second direction Y. The second touch pad layer 270 may include a plurality of extender 273. For example, as shown in FIGS. 3 and 4, the second touch pad layer 270 may include two extender 273. In this instance, the two extender 273 may extend in parallel to each other. For instance, the two extender 273 may extend in the second direction Y. The extender 273 may be narrower (e.g., in the first direction X) than the first portion 271 and the second portion 272. Further, the extender 273 may be narrower than the first touch pad layer 260. The extender 273 may further include a protrusion 275 protruding in the first direction X.

As described above, a sealing member 150 may be provided between the substrate 110 and the encapsulation substrate 130. The sealing member 150 and the touch pad 250 are provided in the peripheral area PA. The sealing member 150 and the touch pad 250 may overlap each other in the peripheral area PA. In this instance, the sealing member 150 may be provided below the encapsulation substrate 130, and the touch pad 250 may be provided over the encapsulation substrate 130. The sealing member 150 may be provided between the substrate 110 and the encapsulation substrate 130 to seal the light-emitting device 120 therebetween, and a curing process may be performed by irradiating UV rays. In this instance, when the touch pad 250 is formed of an opaque metal material, a portion where the sealing member 150 and the touch pad 250 overlap each other may be improperly cured. According to some exemplary embodiments, since the second touch pad layer 270 of the touch pad 250 is made of a metal material and the first touch pad layer 260 is made of a transparent metal oxide, the process for curing the sealing member 150 may be properly performed. In some exemplary embodiments, the extender 273 of the second touch pad layer 270 is formed to be narrower than the first portion 271 and the second portion 272, and it may be formed to be narrower than the first touch pad layer 260. The sealing member 150 overlaps the extender 273 of the second touch pad layer 270, and the sealing member 150 does not overlap the first portion 271 and the second portion 272 such that the process for curing the sealing member 150 may be properly performed.

When the touch pad 250 is totally formed to be narrow so as to perform the curing process, resistance of the touch pad 250 may increase. In some exemplary embodiments, the touch pad 250 includes a first touch pad layer 260 made of a transparent metal oxide and a second touch pad layer 270 made of a metal material. To this end, the first touch pad layer 260 is formed to be relatively wide, and the extender 273 of the second touch pad layer 270 is formed to be relatively narrow, thereby preventing resistance of the touch pad 250 from increasing. In addition, the extender 273 of the second touch pad layer 270 is allowed to partly include the protrusion 275, thereby preventing the increase of resistance.

The flexible printed circuit board 310 may overlap the touch pad 250. A flexible printed circuit pad 320 may be provided on the flexible printed circuit board 310. The flexible printed circuit pad 320 may overlap the touch pad 250. The flexible printed circuit pad 320 may overlap the first touch pad layer 260 of the touch pad 250, and may overlap the second touch pad layer 270. The flexible printed circuit pad 320 may be provided to face the touch pad 250. The flexible printed circuit pad 320 may be provided to face the second touch pad layer 270 of the touch pad 250. The flexible printed circuit pad 320 is connected to a predetermined circuit provided in the flexible printed circuit board 310. The flexible printed circuit pad 320 may be formed of a metal material. The flexible printed circuit pad 320 may be formed to be a rectangle (or generally a rectangle) substantially extending in the second direction Y in a plan view. The flexible printed circuit pad 320 may extend parallel to the first touch pad layer 260 and the extender 273 of the second touch pad layer 270. The flexible printed circuit pad 320 may be formed to be a rectangle including two short sides parallel to the first direction X and two long sides parallel to the second direction Y. A planar shape of the flexible printed circuit pad 320 may be similar to a planar shape of the first touch pad layer 260. This, however, is an example, and the flexible printed circuit pad 320 may have various planar shapes.

The conductive bonding member 500 is provided between the touch pad 250 and the flexible printed circuit board 310. The conductive bonding member 500 is provided between the second touch pad layer 270 of the touch pad 250 and the flexible printed circuit pad 320. The conductive bonding member 500 may overlap the touch pad 250 and the flexible printed circuit pad 320 in a plan view. The conductive bonding member 500 is bonded to the second touch pad layer 270 of the touch pad 250, and the conductive bonding member 500 may be bonded to the flexible printed circuit pad 320. One touch pad 250 may overlap a plurality of conductive bonding members 500. Therefore, the second touch pad layer 270 and the flexible printed circuit pad 320 may be electrically connected to each other through a plurality of conductive bonding members 500.

The conductive bonding member 500 may be fusion bonded to the second touch pad layer 270 and the flexible printed circuit pad 320. The fusion bonding method will now be described. A touch pad 250 including a first touch pad layer 260 and a second touch pad layer 270 is formed on the encapsulation substrate 130, and a flexible printed circuit pad 320 is formed on the flexible printed circuit board 310. A resin including at least one conductive bonding member 500 is applied to the touch pad 250 and the encapsulation substrate 130. The flexible printed circuit board 310 is provided to overlap the conductive bonding member 500 and the touch pad 250. In this instance, the conductive bonding member 500 may contact the second touch pad layer 270, and it may contact the flexible printed circuit pad 320. When heat of 150 degrees Celsius to 170 degrees Celsius is applied to the conductive bonding member 500 and around the same, the conductive bonding member 500 may melt and may be bonded to the second touch pad layer 270 provided below the conductive bonding member 500. Simultaneously, the conductive bonding member 500 may be bonded to the flexible printed circuit pad 320 provided thereon. For instance, the conductive bonding member 500 may be bonded to the second touch pad layer 270 and the flexible printed circuit pad 320 by applying heat and melting the conductive bonding member 500.

The fusion bonding method is an example, and the conductive bonding members 500 may be bonded to the second touch pad layer 270 and the flexible printed circuit pad 320 according to another or additional method. For example, the conductive bonding members 500 may be ultrasonic wave bonded to the second touch pad layer 270 and the flexible printed circuit pad 320. An ultrasonic wave bonding method will now be described. A touch pad 250 including a first touch pad layer 260 and a second touch pad layer 270 is formed on the encapsulation substrate 130, and a flexible printed circuit pad 320 is formed on the flexible printed circuit board 310. A resin including at least one conductive bonding member 500 is applied to the touch pad 250 and the encapsulation substrate 130. A flexible printed circuit board 310 is provided to overlap the conductive bonding member 500 and the touch pad 250. In this instance, the conductive bonding member 500 may contact the second touch pad layer 270, and may contact the flexible printed circuit pad 320. An ultrasonic wave vibration is applied to the conductive bonding member 500 and the surrounding area thereof to thus cause a molecular movement on a contact side between the conductive bonding member 500 and the second touch pad layer 270 and between the conductive bonding member 500 and the flexible printed circuit pad 320. As such, heat is generated on the contact side between the conductive bonding member 500 and the second touch pad layer 270 such that the conductive bonding member 500 may be bonded to the second touch pad layer 270. Simultaneously, heat may be generated on the contact side between the conductive bonding member 500 and the flexible printed circuit pad 320 so that the conductive bonding member 500 may be bonded to the flexible printed circuit pad 320. In addition, the conductive bonding member 500 may be bonded to the second touch pad layer 270 and the flexible printed circuit pad 320 through various metal bonding methods.

The conductive bonding member 500 may be circular in a plan view. This, however, is an example, and the conductive bonding member 500 may have various modifiable planar shapes. The conductive bonding member 500 may be made of a metal material. For example, it may be formed of various metal materials, such as at least one of tin (SN), tin-bismuth (Sn—Bi), tin-silver (Sn—Ag), tin-indium (Sn—In), and indium-bismuth (In—Bi). The conductive bonding member 500 may be made of a metal material that melts at a predetermined temperature. When the fusion bonding method is used, heat corresponding to a melting point of the conductive bonding member 500 is applied such that the conductive bonding member 500 may be bonded to the second touch pad layer 270 and the flexible printed circuit pad 320. In this instance, the temperature of the heat applied to the conductive bonding member 500 is variable by the material of the conductive bonding member 500.

According to some embodiments, the resin including the conductive bonding member 500 may be configured to reduce thermal stresses and strains due to differences in coefficients of thermal expansion between surrounding components, such as amongst the conductive bonding member 500, the flexible circuit pad 320, the flexible printed circuit board 310, the extender 273, and the first touch pad layer 260. The resin may also serve to reduce mechanical, shock, and vibration stresses and strains to further increase the reliability of the electrical connection between flexible printed circuit board 310 and first touch pad layer 260. In addition, the resin may be configured to improve a distribution of a plurality of conductive bonding members 500 between flexible printed circuit pad 320 and first touch pad layer 260. In some embodiments, an underfill between the conductive bonding members 500 may be additionally (or alternatively) utilized.

When an anisotropic conductive film (ACF) is used as the conductive bonding member 500 instead of a metal material, adherence may be low and resistance may also be low. The anisotropic conductive film may be formed of a conductive ball generated by coating a metal film on a surface of a polymer ball. However, as an area of the display area DA increases, the area of the peripheral area PA relatively reduces, and the size of the touch pad 250 accordingly reduces. When an anisotropic conductive film is provided between the touch pad 250 and the flexible printed circuit pad 320 and a compression process is performed, pressure is applied to the conductive ball. When the size of the touch pad 250 reduces, the pressure applied to the conductive ball may increase and the conductive ball may be broken. When the conductive ball is broken, it loses a restoration force and its reliability is lowered.

According to some exemplary embodiments, reliability is improved by electrically connecting the touch pad 250 and the flexible printed circuit pad 320 through the conductive bonding member 500 made of a metal material. The conductive bonding member 500 and the touch pad 250 do not simply contact each other, but they are bonded with each other by a method, such as fusion bonding or ultrasonic wave bonding, so adherence between the conductive bonding member 500 and the touch pad 250 may be increased and the resistance may be reduced. For the above-noted bonding, the second touch pad layer 270 contacting the conductive bonding member 500 may be made of a metal material from among the first touch pad layer 260 and the second touch pad layer 270 configuring the touch pad 250. In a like manner, the conductive bonding member 500 and the flexible printed circuit pad 320 do not simply contact each other, but they are bonded with each other by a method, such as fusion bonding or ultrasonic wave bonding, so adherence between the conductive bonding member 500 and the flexible printed circuit pad 320 may be increased and resistance may be reduced.

According to various exemplary embodiments, the display panel 100 of a display device may include the substrate 110 and the encapsulation substrate 130 facing the substrate 110, the sealing member 150 may be provided between the substrate 110 and the encapsulation substrate 130 to seal the light-emitting device 120 therebetween, and the touch sensor 200 may be provided on the encapsulation substrate 130, but embodiments are not limited thereto. Instead of the encapsulation substrate 130 and the sealing member 150, a thin film encapsulation layer may be provided on the substrate 110. In this instance, the light-emitting device 120 may be provided between the substrate 110 and the thin film encapsulation layer, and the touch sensor 200 may be provided on the thin film encapsulation layer. The thin film encapsulation layer may seal the light-emitting device 120 to prevent external moisture and oxygen from permeating. The thin film encapsulation layer may have a multi-layered structure. For example, the thin film encapsulation layer may have a structure in which at least one inorganic film and at least one organic film are stacked.

A display device according to some exemplary embodiments will now be described with reference to FIG. 6.

The display device according to some exemplary embodiments described in association with FIG. 6 mostly corresponds to the display device described in association with FIGS. 1 to 5, so no repeated portions will be described. The touch pad 250_1 described hereinafter is different from the touch pad 250.

Figure 6:
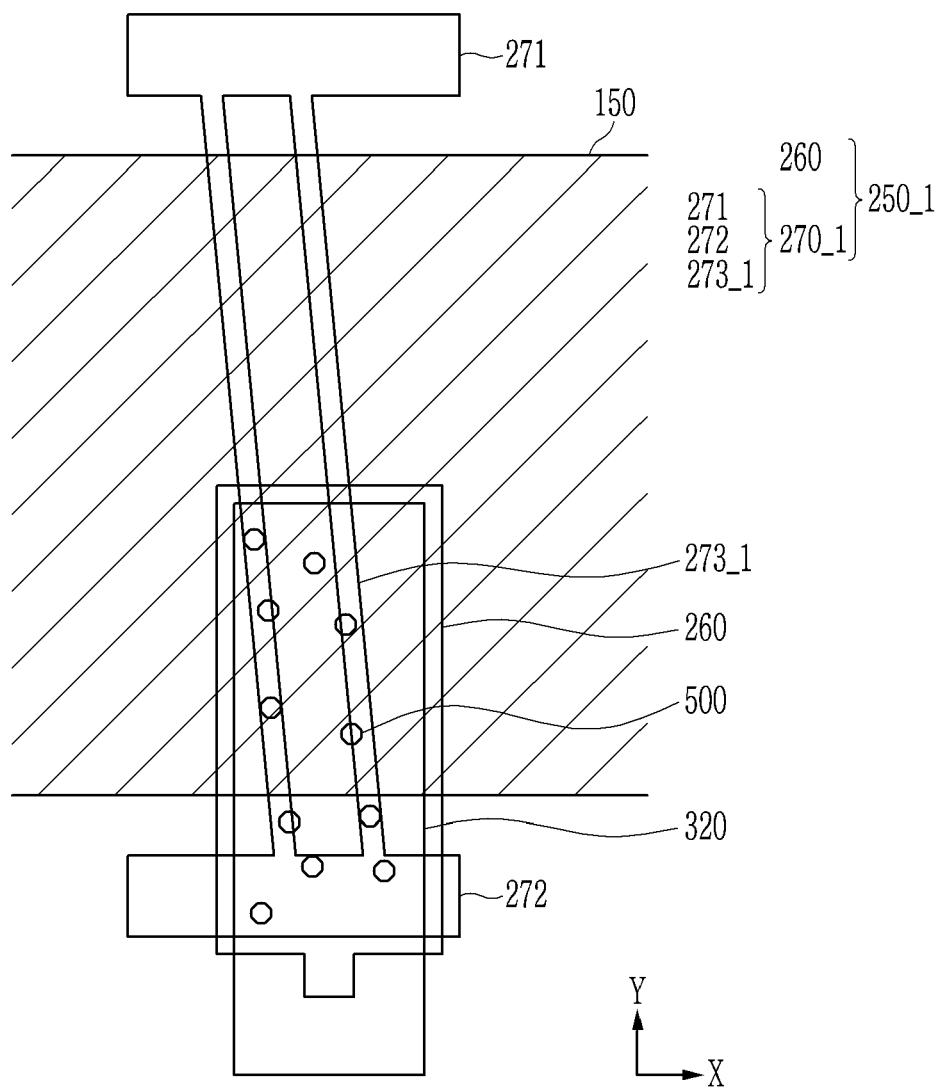
FIG. 6 shows an enlarged top plan view of a predetermined region of a display device according to some exemplary embodiments.

FIG. 6 shows an enlarged top plan view of a predetermined region of a display device according to some exemplary embodiments. FIG. 6 shows a touch pad 250_1 of a touch sensor of a display device according to an exemplary embodiment, and a peripheral side thereof.

In a like manner of the above-described exemplary embodiments, the display device according to some exemplary embodiments may include a display panel and a touch sensor. As shown in FIG. 6, the touch sensor includes a touch pad 250_1, and the touch pad 250_1 includes a first touch pad layer 260 and a second touch pad layer 270_1. The touch pad 250_1 overlaps the sealing member 150, the conductive bonding member 500, and the flexible printed circuit pad 320.

In the previous exemplary embodiments, the extender 273 of the first touch pad layer 260 and the second touch pad layer 270 may extend in parallel. Further, the second touch pad layer 270 may extend in parallel to the flexible printed circuit pad 320. As seen in FIG. 6, the extender 273_1 of the second touch pad layer 270_1 may extend in an oblique way with respect to a length direction of the first touch pad layer 260. Further, the extender 273_1 of the second touch pad layer 270_1 may extend in an oblique way with respect to a length direction of the flexible printed circuit pad 320. The first touch pad layer 260 and the flexible printed circuit pad 320 may each be formed to be a rectangle substantially extending in the second direction Y in a plan view. The extender 273_1 of the second touch pad layer 270_1 may be formed to have a bar shape extending in an oblique way with respect to the second direction Y. The second touch pad layer 270_1 may include a plurality of extenders 273_1. In this instance, a plurality of extenders 273_1 may extend in parallel to each other.

As the extender 273_1 of the second touch pad layer 270_1 extends in an oblique way with respect to the first touch pad layer 260, the contact area of the first touch pad layer 260 and the second touch pad layer 270_1 increases compared to the case in which the same extends in parallel to the first touch pad layer 260, thereby reducing resistance. In a like manner, as the extender 273_1 of the second touch pad layer 270_1 extends in an oblique way with respect to the flexible printed circuit pad 320, the bonding area of the second touch pad layer 270_1 and the conductive bonding member 500 may be increased compared to the case in which the same extends in parallel to the flexible printed circuit pad 320. Accordingly, resistance between the second touch pad layer 270_1 and the flexible printed circuit pad 320 may be reduced.

A display device according to some exemplary embodiments will now be described with reference to FIG. 7.

The display device according to some exemplary embodiments described in association with FIG. 7 mostly correspond to the display device described in association with FIGS. 1 to 5, so no repeated portions will be described. The touch pad 270_2 described hereinafter has a different shape from the touch pad 250.

Figure 7:
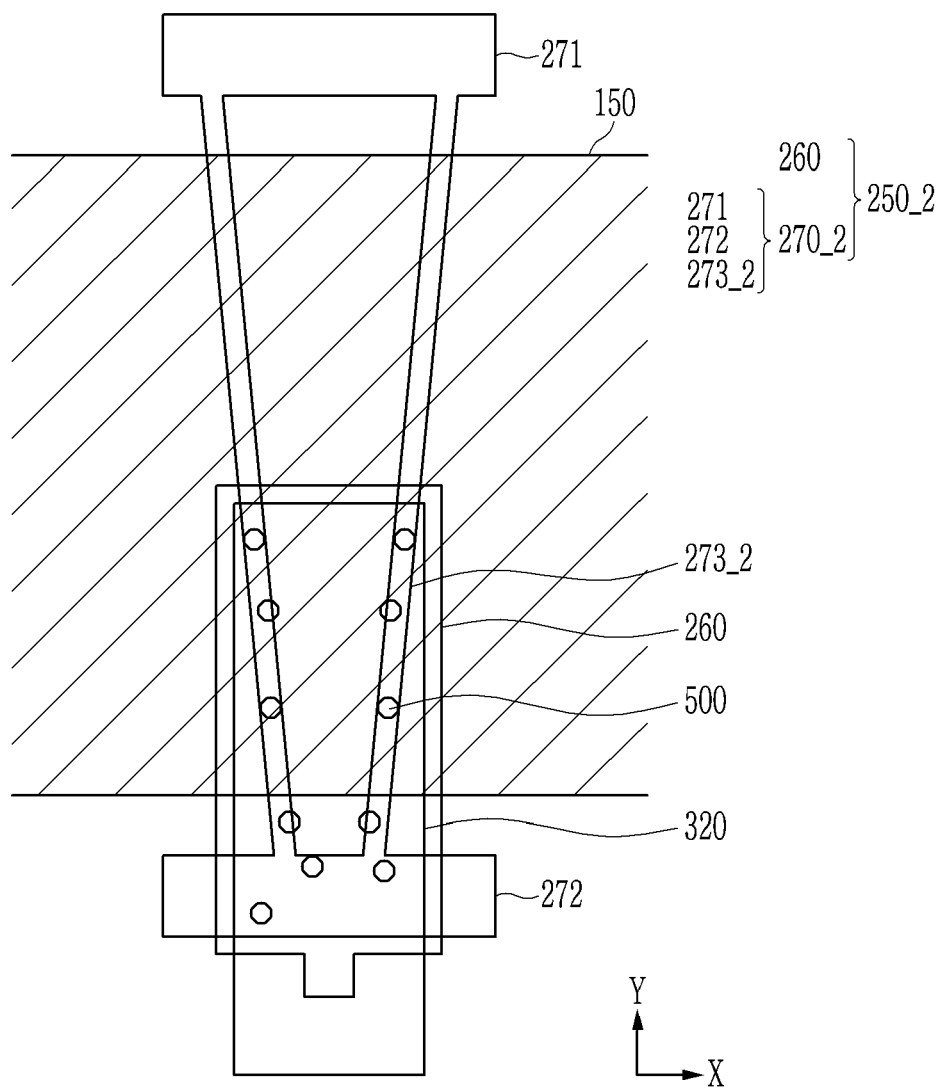
FIG. 7 shows an enlarged top plan view of a predetermined region of a display device according to some exemplary embodiments.

FIG. 7 shows an enlarged top plan view of a predetermined region of a display device according to some exemplary embodiments. FIG. 7 shows a touch pad 270_2 of a touch sensor of a display device according to an exemplary embodiment, and a peripheral side thereof.

In a like manner of the previous exemplary embodiments, the display device according to some exemplary embodiments may include a display panel and a touch sensor. As shown in FIG. 7, the touch sensor includes a touch pad 250_2, and the touch pad 250_2 includes a first touch pad layer 260 and a second touch pad layer 270_2. The touch pad 250_2 overlaps the sealing member 150, the conductive bonding member 500, and the flexible printed circuit pad 320.

In the previous exemplary embodiments, the second touch pad layer 270 may include a plurality of extenders 273, and the plurality of extenders 273 may extend in parallel to each other. As seen in FIG. 7, the second touch pad layer 270_2 may include a plurality of extenders 273_2, and the plurality of extenders 273_2 may extend in different directions. The second touch pad layer 270_2 may include a plurality of extenders 273_2. Distances among the plurality of extenders 273_2 may become greater as the extenders 273_2 become more distant from the second portion 272. This, however, is an example, and the distances among the plurality of extenders 273_2 may be reduced as the extenders 273_2 become more distant from the second portion 272. In another example, the distances among the plurality of extenders 273_2 may become greater as the extenders 273_2 approach a middle region between first portion 271 and second portion 272 and may become smaller as the extenders 273_2 approach the first portion 271 and the second portion 272. A plurality of extenders 273_2 may extend in an oblique way with respect to the first touch pad layer 260. This, however, is an example, and some of a plurality of extenders 273_2 may extend in parallel to the first touch pad layer 260, and others thereof may extend in an oblique way with respect to the first touch pad layer 260. Further, a plurality of extenders 273_2 may extend in an oblique way with respect to the flexible printed circuit pad 320. This, however, is an example, and some of a plurality of extenders 273_2 may extend in parallel to the flexible printed circuit pad 320, and the others thereof may extend in an oblique way with respect to the flexible printed circuit pad 320.

A display device according to some exemplary embodiments will now be described with reference to FIG. 8.

The display device according to some exemplary embodiments described in association with FIG. 8 mostly correspond to the display device described in association with FIGS. 1 to 5, so no repeated portions will be described. The touch pad 270_3 described hereinafter has a different shape from the touch pad 250.

Figure 8:
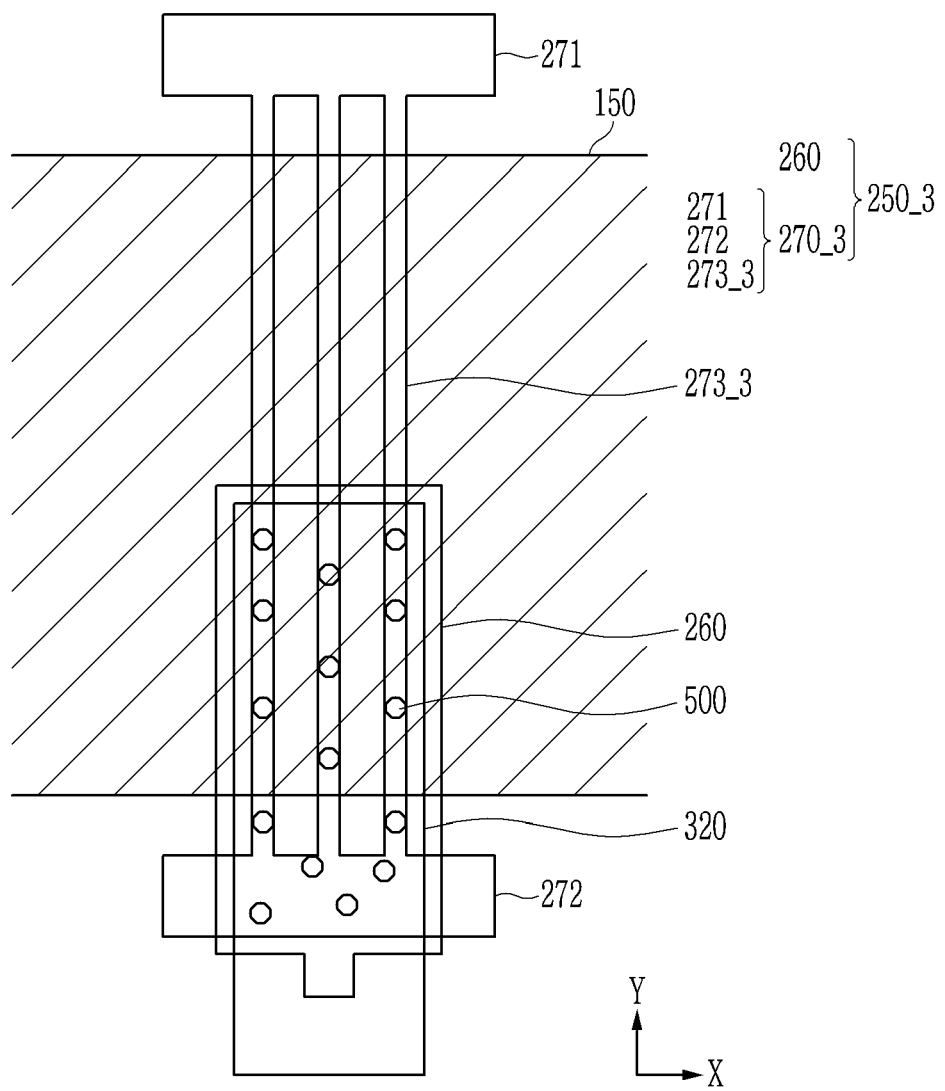
FIG. 8 shows a top plan view of an enlarged predetermined region of a display device according to some exemplary embodiments.

FIG. 8 shows an enlarged top plan view of a predetermined region of a display device according to some exemplary embodiments. FIG. 8 shows a touch pad 270_3 of a touch sensor of a display device according to an exemplary embodiment, and a peripheral side thereof.

In a like manner of the previous exemplary embodiments, the display device according to some exemplary embodiments includes a display panel and a touch sensor. As shown in FIG. 8, the touch sensor includes a touch pad 250_3, and the touch pad 250_3 includes a first touch pad layer 260 and a second touch pad layer 270_3. The touch pad 250_3 overlaps the sealing member 150, the conductive bonding member 500, and the flexible printed circuit pad 320.

In the previous exemplary embodiments, the second touch pad layer 270 may include two extenders 273. As seen in FIG. 8, the second touch pad layer 270_3 may include three extenders 273_3. As the second touch pad layer 270_3 includes three extenders 273_3, resistance may be reduced by increasing the contact area of the first touch pad layer 260 and the second touch pad layer 270_3 compared to the case in which the touch pad 250 includes two extenders 273. In a like manner, as the second touch pad layer 270_3 includes three extenders 273_3, the bonding area of the second touch pad layer 270_3 and the conductive bonding member 500 may be increased compared to the case in which the second touch pad layer 270 includes two extenders 273. By this, resistance between the second touch pad layer 270_3 and the flexible printed circuit pad 320 may be reduced.

In a like manner of the previous exemplary embodiments, a plurality of extenders 273_2 of the second touch pad layer 270_3 may extend in parallel to the first touch pad layer 260 and the flexible printed circuit pad 320, and/or the extenders 273_3 may extend in an oblique direction. Further, some of a plurality of extenders 273_3 of the second touch pad layer 270_3 may extend in an oblique way with respect to the first touch pad layer 260 and the flexible printed circuit pad 320. In addition, a extender, such as at least one of extenders 273_1, 273_2, and 273_3, of a second touch pad layer, such as at least one of second touch pad layers 270_1, 270_2, and 270_3, may include protrusions.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A touch sensor comprising:
a touch sensing region;
a touch sensing electrode in the touch sensing region;
a touch extending wire extended to the touch sensing electrode;
a touch pad on an end of the touch extending wire;
a flexible printed circuit board overlapping the touch pad;
a flexible printed circuit pad on the flexible printed circuit board and facing the touch pad; and
a conductive bonding member between the touch pad and the flexible printed circuit pad, the conductive bonding member being bonded to each of the touch pad and the flexible printed circuit pad,
wherein the touch pad comprises:
a first touch pad layer made of a transparent metal oxide; and
a second touch pad layer on the first touch pad layer, the second touch pad layer being made of a non-transparent metal material, and
wherein the conductive bonding member is bonded to the second touch pad layer,
wherein the second touch pad layer comprises:
a first portion and a second portion separated from each other; and
an extender extending to the first portion and the second portion, and
wherein the extender of the second touch pad layer and the flexible printed circuit pad extend parallel to each other or the extender of the second touch pad layer extends in an oblique direction with respect to a length direction of the flexible printed circuit pad.

2. The touch sensor of claim 1, wherein:
the conductive bonding member is made of a metal material;
the metal material of the conductive bonding member contacts the non-transparent metal material of the second touch pad layer; and
the conductive bonding member is fusion bonded or ultrasonic wave bonded to each of the touch pad and the flexible printed circuit pad.

3. The touch sensor of claim 1, wherein the extender of the second touch pad layer is narrower than the first touch pad layer.

4. The touch sensor of claim 3, wherein the second touch pad layer comprises a plurality of extenders, the extender being one of the plurality of extenders.

5. The touch sensor of claim 4, wherein the plurality of extenders extend parallel to each other.

6. The touch sensor of claim 4, wherein at least one of the plurality of extenders extends in a different direction than another one of the plurality of extenders.

7. A display device comprising:
a substrate comprising a touch sensing region;
a light-emitting device on the substrate;
an encapsulation structure on the light-emitting device;
a touch sensing electrode in the touch sensing region on the encapsulation structure;
a touch extending wire extended to the touch sensing electrode;
a touch pad on an end of the touch extending wire;
a flexible printed circuit board overlapping the touch pad;
a flexible printed circuit pad on the flexible printed circuit board and facing the touch pad; and
a conductive bonding member between the touch pad and the flexible printed circuit pad, the conductive bonding member being bonded to each of the touch pad and the flexible printed circuit pad,
wherein the touch pad comprises:
a first touch pad layer made of a transparent metal oxide; and
a second touch pad layer on the first touch pad layer, the second touch pad layer being made of a non-transparent metal material, and
wherein the conductive bonding member is bonded to the second touch pad layer;
wherein the second touch pad layer comprises:
a first portion and a second portion separated from each other; and
an extender extending to the first portion and the second portion, and
wherein the extender of the second touch pad layer and the flexible printed circuit pad extend parallel to each other or the extender of the second touch pad layer extends in an oblique direction with respect to a length direction of the flexible printed circuit pad.

8. The display device of claim 7, further comprising:
a sealing member between the substrate and the encapsulation structure,
wherein the touch pad overlaps the sealing member.

9. The display device of claim 7, wherein:
the conductive bonding member is made of a metal material;
the metal material of the conductive bonding member contacts the non-transparent metal material of the second touch pad layer; and
the conductive bonding member is fusion bonded or ultrasonic wave bonded to each of the touch pad and the flexible printed circuit pad.

10. The display device of claim 7, wherein the extender of the second touch pad layer is narrower than the first touch pad layer.

11. The display device of claim 10, wherein the second touch pad layer comprises a plurality of extenders, the extender being one of the plurality of extenders.

12. The display device of claim 11, wherein the plurality of extenders extend parallel to each other.

13. The display device of claim 11, wherein at least one of the plurality of extenders extends in a different direction than another one of the plurality of extenders.

* * * * *